(12) United States Patent
Sheu et al.

(10) Patent No.: US 7,787,281 B2
(45) Date of Patent: Aug. 31, 2010

(54) WRITING CIRCUIT FOR A PHASE CHANGE MEMORY

(75) Inventors: Shyh-Shyuan Sheu, Taichung (TW); Lieh-Chiu Lin, Kaohsiung (TW); Pei-Chia Chiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/957,044

(22) Filed: Dec. 14, 2007

(65) Prior Publication Data

US 2009/0010047 A1    Jan. 8, 2009

(30) Foreign Application Priority Data

Jul. 5, 2007    (TW) .............................. 96124453 A

(51) Int. Cl.
  *G11C 11/00*    (2006.01)
(52) U.S. Cl. ........................ 365/148; 365/158; 365/163
(58) Field of Classification Search ................. 365/148, 365/158, 163, 171, 173
See application file for complete search history.

(56) References Cited

U.S. PATENT DOCUMENTS

| | | | | |
|---|---|---|---|---|
| 6,594,176 B2 * | 7/2003 | Lammers | .................... | 365/171 |
| 6,791,867 B2 * | 9/2004 | Tran | ........................... | 365/163 |
| 6,985,376 B2 * | 1/2006 | Matsuoka | .................... | 365/148 |
| 7,365,355 B2 * | 4/2008 | Parkinson | .................... | 365/163 |
| 7,423,898 B2 * | 9/2008 | Tanizaki et al. | ............. | 365/148 |
| 7,436,699 B2 * | 10/2008 | Tanizaki et al. | ............. | 365/158 |
| 7,460,389 B2 * | 12/2008 | Hsu et al. | ................... | 365/163 |
| 7,471,557 B2 * | 12/2008 | Johnson | ...................... | 365/163 |
| 2008/0310217 A1 * | 12/2008 | Chiang et al. | | |

* cited by examiner

*Primary Examiner*—Trong Phan

(57) ABSTRACT

A phase change memory writing circuit is provided. The circuit comprises a writing path and a fast write control unit. The writing path further comprises a current driving unit, a first switch device and a phase change memory cell. The current driving unit is coupled to a high voltage source and outputs a driving current. The first switch device is controlled by a first control signal. The fast write control unit is coupled to the writing path to provide a writing voltage to the writing path. When the first switch device is turned off, the fast write control unit outputs the writing voltage to the writing path. When the first switch device is turned on, the fast write control unit stops outputting the writing voltage to the writing path.

19 Claims, 10 Drawing Sheets

WRITING CIRCUIT FOR A PHASE CHANGE MEMORY

BACKGROUND OF THE INVENTION

1. Field of the Invention

The invention relates to a writing circuit for a phase change memory, and more particularly to a fast writing circuit for a phase change memory with one current source.

2. Description of the Related Art

With the growth in use of portable electronic devices, the demand for non-volatile memory has increased. Among the various kinds of non-volatile memory, phase change memory is the most competitive next generation non-volatile memory due to its faster speed, lower power consumption, higher capacity, reliability, easier process integration and lower cost.

The SET and RESET operations are mainly achieved by inputting two current pulses with different current magnitudes to the phase change memory to switch the phase change memory between an amorphous state and a crystalline state. According to Ohm's Law, when the current is input to the phase change memory, the phase change memory is heated. The phase change memory may thus be crystallized or fused based on different currents. Based on the described, the logic state of the phase change memory can be switched by inputting different currents, enabling data storage. FIG. 1 is a schematic diagram showing the writing current pulse and the reading current pulse $I_{read}$ of the phase change memory. When a RESET operation is applied to the phase change memory, a reset current $I_{RESET}$ with high amplitude and short duration is applied, the phase change memory is thus fused because the temperature of the phase change memory exceeds the fusion temperature of the phase change material of the phase change memory. When the temperature of the phase change memory decreases, the state of the phase change memory is transformed to the amorphous state due to an insufficient cool down period. Thus the phase change memory has high resistance. When a SET operation is applied to the phase change memory, a set current $I_{SET}$ with lower amplitude and longer duration is applied. The phase change memory is heated by the set current $I_{SET}$, and the temperature of the phase change memory is held substantially between the fusion temperature and a crystallizing temperature of the phase change material used by the phase change memory. During the SET operation, the fused phase change memory has sufficient time for crystallizing and the phase change memory thus has low resistance.

FIG. 2 is a schematic diagram of a conventional SET signal for the phase change memory. The SET signal comprises a first crystallizing current pulse $I_{SET1}$ and a second crystallizing current pulse $I_{SET2}$. The first crystallizing current pulse $I_{SET1}$ has a first peak current and the duration time of the first peak current $I_{P1}$ is a first time period t1. The second crystallizing current pulse $I_{SET2}$ has a second peak current $I_{P2}$ and the duration time of the second peak current is a second time period t2.

The conventional SET signal is generated by combining two current pulses with different peak currents, and the conventional SET operation is achieved by inputting a SET signal, such as the SET signal illustrated in FIG. 2, to the phase change memory. When comparing the first crystallizing current pulse $I_{SET1}$ and the second crystallizing current pulse $I_{SET2}$, the first peak current is higher than the second peak current, and the first time period is shorter than the second time period. Therefore, when the first crystallizing current pulse $I_{SET1}$ is input to the phase change memory, the phase change material of the phase change memory is quickly heated, and partial phase change material is crystallized. Then, when the second crystallizing current pulse $I_{SET2}$ is input to the phase change memory with lower current and longer time, the phase change material is completely crystallized. According to the described operation, reliability and the uniformity of the phase change memory can be improved.

FIG. 3 is a schematic diagram of a current generator outputting the SET signal shown in FIG. 2. The first current generator 31 and the second current generator 32 are coupled to the adder 35 respectively, via a first diode 33 and a second diode 34. The first current generator 31 outputs a first current pulse having an amplitude of ($I_{P1}$-$I_{P2}$), and the second current pulse generator outputs a second current pulse having an amplitude of $I_{P2}$. The first current generator 31 and the second current generator 32 simultaneously output the first current pulse and the second current pulse for a duration time t1 based on the control signals S1 and S2. Then, the control signal S1 disables the first current generator 31 to stop outputting the first current pulse and the second control signal S2 controls the second current generator 32 to output the second current pulse for a duration time t2. According to the described operation, the SET signal illustrated in FIG. 2 can be generated.

BRIEF SUMMARY OF THE INVENTION

A phase change memory writing circuit is provided. The circuit comprises a writing path and a fast write control unit. The writing path further comprises a current driving unit, a first switch device and a phase change memory cell. The current driving unit is coupled to a high voltage source and outputs a driving current. The first switch device is controlled by a first control signal. The fast write control unit is coupled to the writing path to provide a writing voltage to the writing path. When the first switch device is turned off, the fast write control unit outputs the writing voltage to the writing path. When the first switch device is turned on, the fast write control unit stops outputting the writing voltage to the writing path.

Another phase change memory writing circuit is disclosed. The circuit comprises a writing path and a control signal generator. The writing path further comprises a current driving unit, a first switch device, a phase change memory cell and a second switch device. The current driving unit is coupled to a high voltage source to output a driving current. The first switch device is controlled by a first control signal and when the first control signal is at a first voltage level, the first switch device is turned on. The phase change memory cell is coupled to the first switch device. The second switch device is coupled between the phase change memory cell and a low voltage source, and when the second control signal is at a second voltage level, the second switch device is turned on. The control signal generator generates the second control signal, wherein the second control signal comprises a first pulse signal with a third voltage level and a second pulse signal with the second voltage level.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
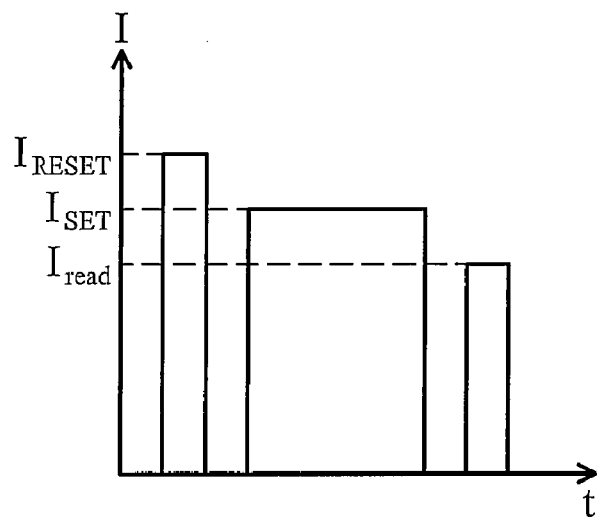
FIG. 1 is a schematic diagram showing the writing current pulse and the reading current pulse of the phase change memory.
Figure 2:
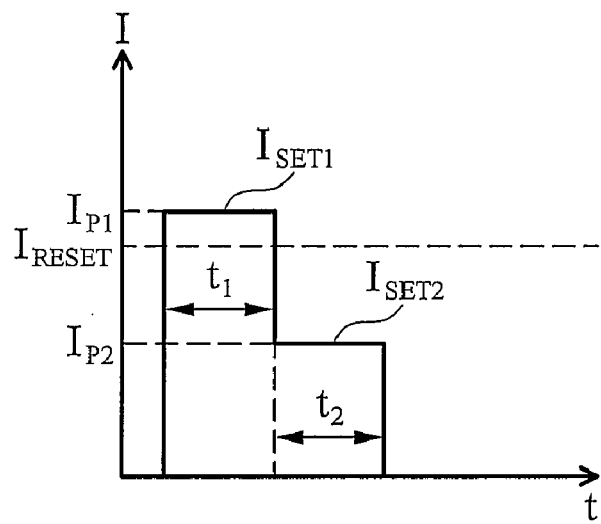
FIG. 2 is a schematic diagram of a conventional SET signal for the phase change memory.
Figure 3:
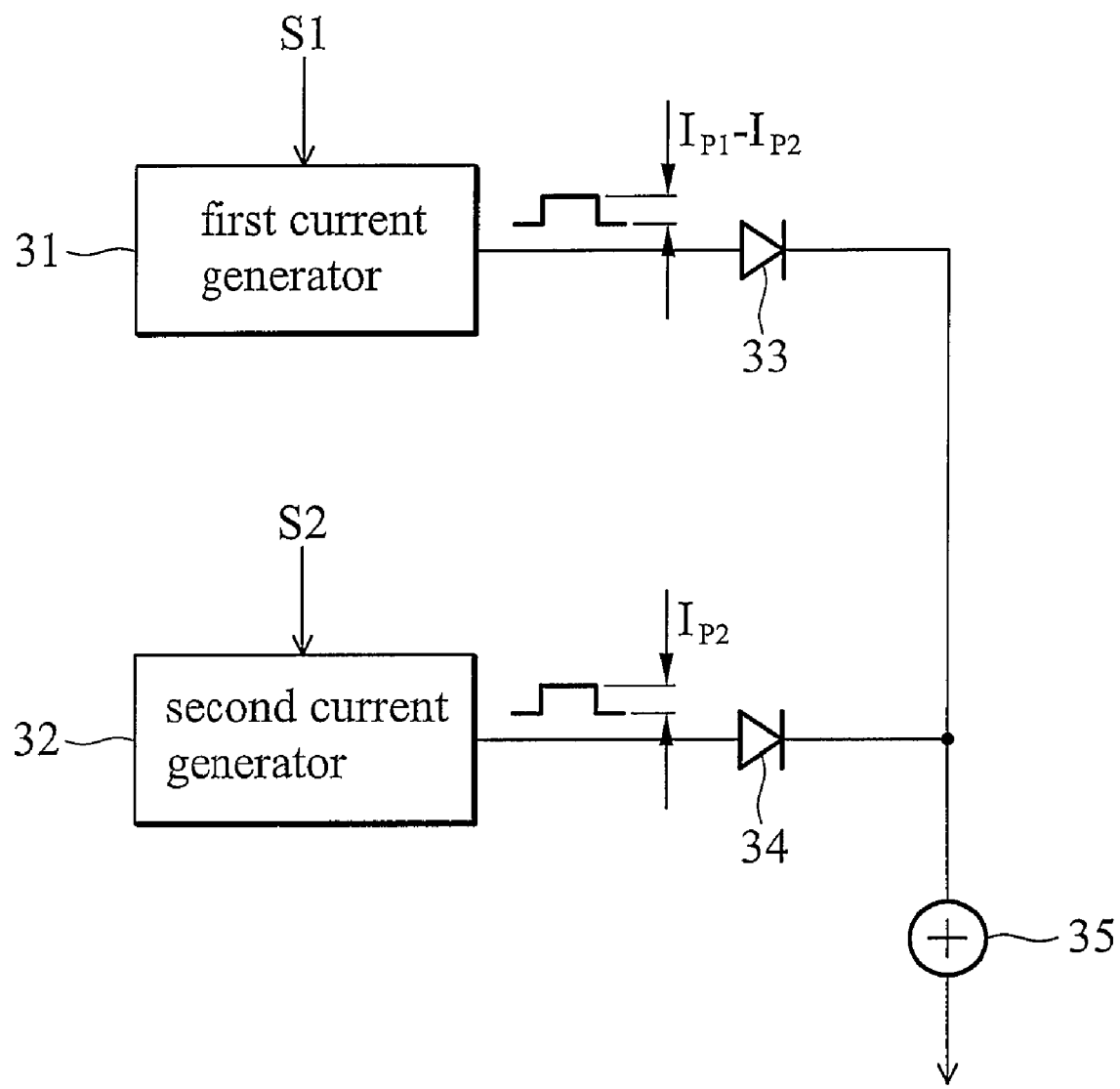
FIG. 3 is a schematic diagram of a current generator outputting the SET signal shown in FIG. 2.

To increase the reliability and the uniformity of the phase change memory, the conventional SET operation is achieved by inputting two current pulses with different magnitude, such as shown in FIG. 2, thus, the material of the phase change memory can be first melted and then crystallized. To achieve that, in the conventional design, multiple current sources or specific current generating circuits are usually utilized; however, this will increase circuit complexity. For this reason, one embodiment of the invention provides a writing circuit for the phase change memory with only one current source and a fast write control unit.

Figure 4:
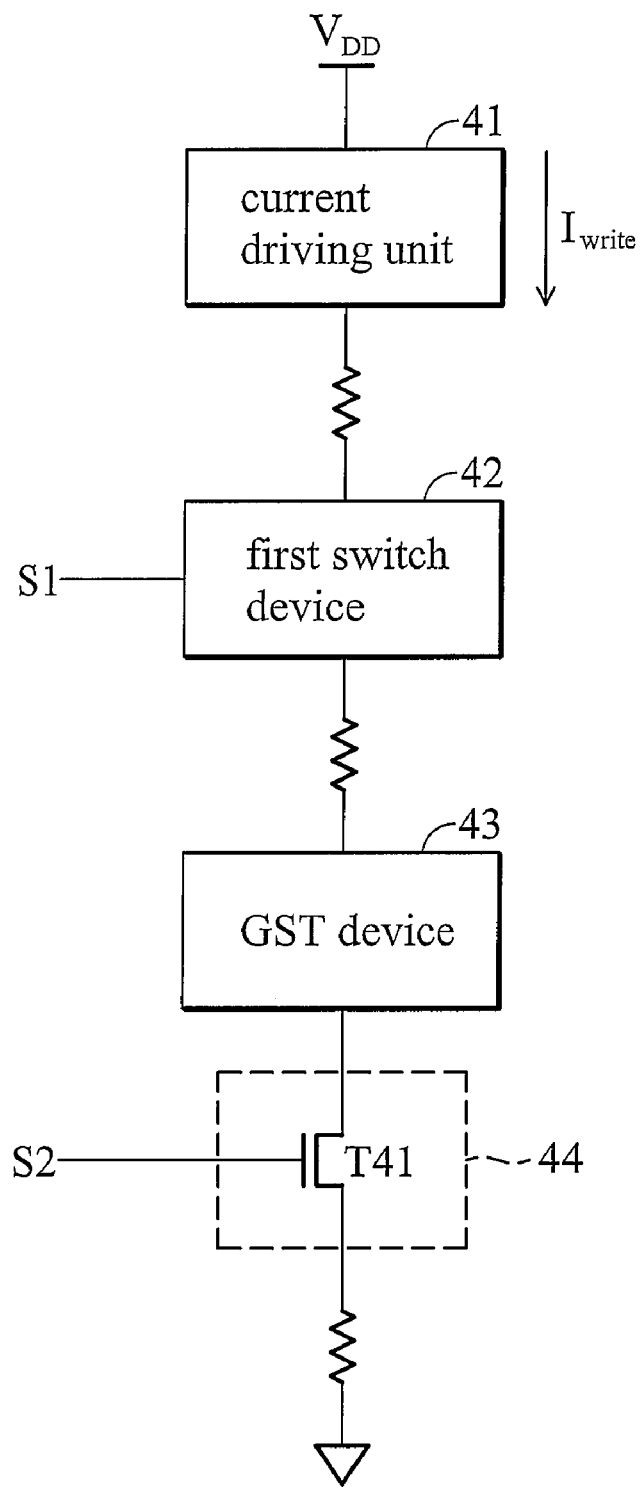
FIG. 4 is a schematic diagram of a writing path according to an embodiment of the invention.

FIG. 4 is a schematic diagram of a writing path according to an embodiment of the invention. The writing path shown in FIG. 4 comprises a current driving unit 41, a first switch device 42, a GeSbTe (abbreviated as GST) device 43 and a second switch device 44. In this embodiment, the writing path comprises only one phase change memory (PCM) cell, the GST device 43. In another embodiment, the writing path comprises a plurality of PCM cells and a phase change memory comprises a plurality of writing paths to form a phase change memory array arranged in a matrix form. The current driving unit 41 is coupled to a high voltage source VDD and provides a writing current Iwrite. The first switch device 42 is turned on based on a first control signal S1. The second switch device 44 is coupled between the GST device 43 and a low voltage source, ground, and is turned on based on a second control signal S2. In this embodiment, the second switch device 44 is a NMOS transistor, and in another embodiment, the second switch device 44 is one or a plurality of PMOS transistors, NMOS transistors, CMOS transistors, transmission gates or other similar elements.

The conductivity of the NMOS transistor is based on the voltage applied to the gate. When the voltages of the source and drain of the NMOS transistor are fixed and the voltage of the gate of the NMOS transistor increases, the equivalent resistance between the source and drain of the NMOS transistor therefore decreases, thus, the current passing through the NMOS transistor T41 increases. According to the above operation, the writing current input to the GST device 43 can be adjusted by adjusting the voltage of the gate of the NMOS transistor T41. Therefore, the writing current can comprise a first writing current which is larger than the reset current IRESET and a second writing current which is smaller than the reset current IRESET.

Figure 5:
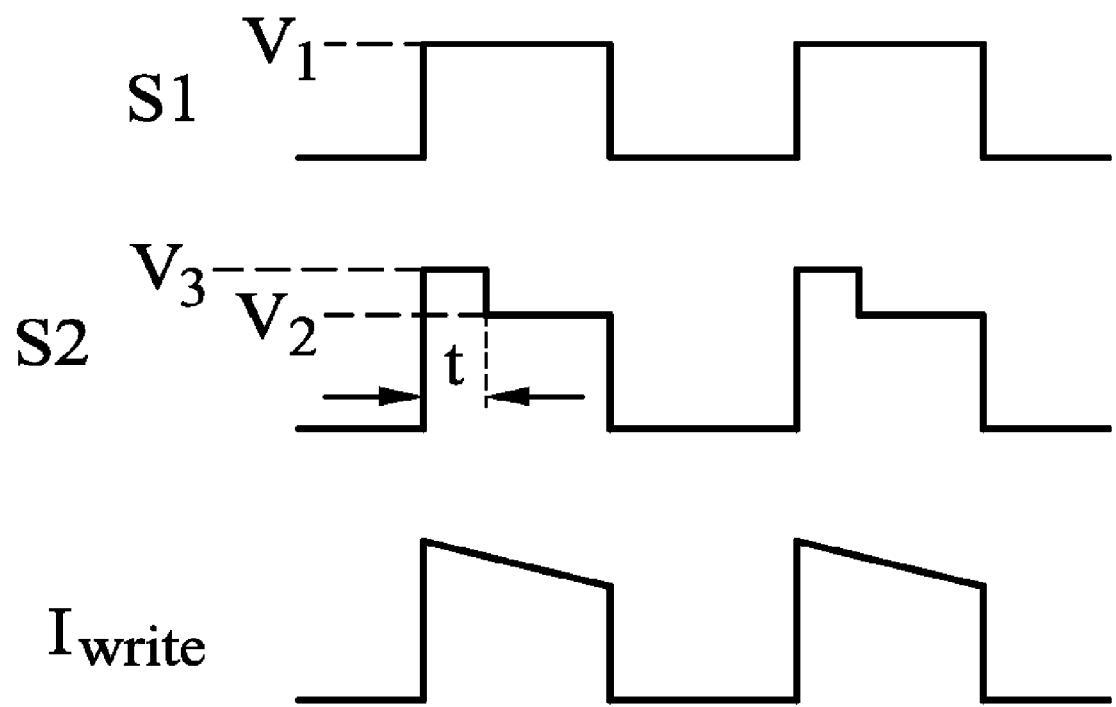
FIG. 5 is a timing diagram of a control signal of the phase change memory writing circuit of FIG. 4.

For further illustration, please refer to FIG. 5. FIG. 5 is a timing diagram of a control signal of the phase change memory writing circuit of FIG. 4. When the first control signal S1 is at high voltage level V1, the first switch device is turned on and the voltage peak of the second control signal S2 is larger than or equal to the high voltage level. The second control signal S2 comprises two voltage pulse signals, wherein the first voltage pulse signal has a voltage peak V3 larger than the high voltage level V2 and the duration of the voltage peak V3 is t. When the gate of the transistor T41 receives the first voltage pulse signal, the equivalent resistance between the source and drain of the NMOS transistor T41 decreases. Accordingly, the equivalent resistance of the writing path therefore decreases, and the writing current Iwrite passing through the GST device 43 increases. According to the above operation, the duration of the writing current Iwrite exceeding the reset current IRESET can be adjusted by adjusting the voltage peak value V3 of the first voltage pulse signal and its duration t.

Figure 6:
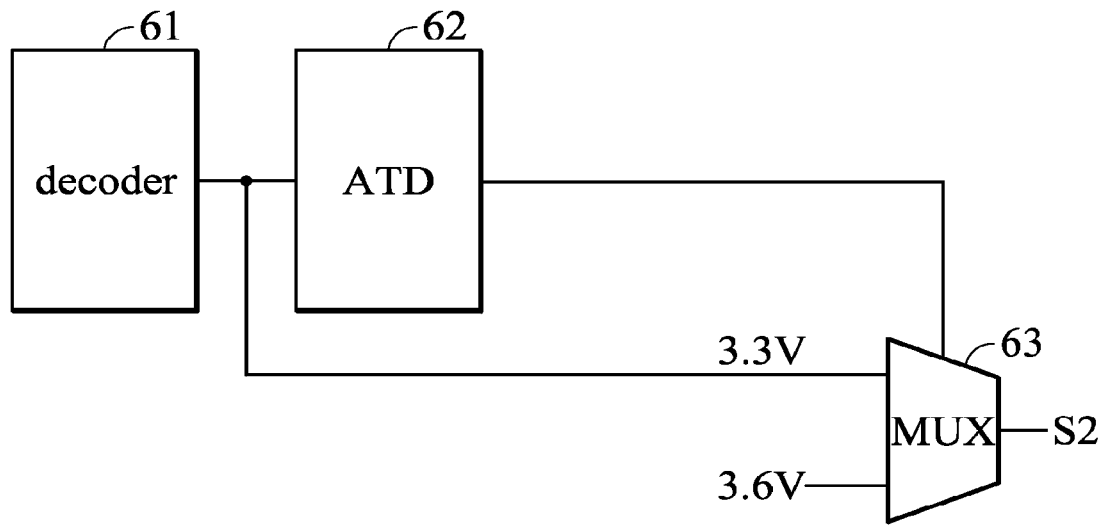
FIG. 6 is a schematic diagram of a second control signal generator based on an embodiment of the invention.

FIG. 6 is a schematic diagram of a second control signal generator based on an embodiment of the invention. In this embodiment, the voltage peak of the first voltage pulse signal is V3 and the high voltage level of the second control signal S2 is V2. In this embodiment, V3 is 3.6V and V2 is 3.3V. The voltage values of V3 and V2 are only used as one example for illustration and are not limited thereto. Those skilled in the art can adjust the voltage value of V3 and V2 based on required circuit designs. The decoder 61 decodes and inputs an address data, and provides a DC voltage 3.3 V to the multiplexer 63. The address translate detector (ATD) 63 receives the address data from the decoder 61 and outputs a control signal when the ATD 63 detects the change of the address. The multiplexer 63 receives the control signal to output the direct voltage 3.6V for a time duration t. After the time duration t, the ATD 63 outputs another control signal to the multiplexer 63 and the multiplexer 63 outputs the direct voltage 3.3V. According to the above operation, the second control signal S2 can be easily implemented.

Figure 7:
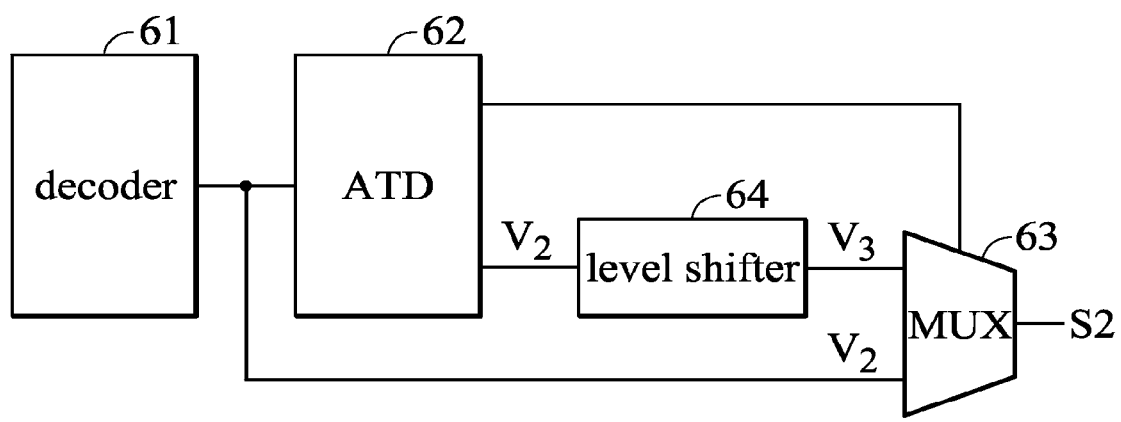
FIG. 7 is a schematic diagram of a second control signal generator based on another embodiment of the invention.

FIG. 7 is a schematic diagram of a second control signal generator based on another embodiment of the invention. In this embodiment, the voltage peak of the first voltage pulse signal is V3 and the high voltage level of the second control signal S2 is V2. The decoder 61 decodes and inputs an address data, and provides a voltage V2 to the multiplexer 63 and ATD 62. The level shifter 64 receives and changes the voltage V2 from the ATD to the voltage V3. When the ATD 63 detects the change of the address, the ATD 63 outputs a control signal. The multiplexer 63 receives the control signal to output the direct voltage 3.6V for a time duration t. After the time duration t, the ATD 63 outputs another control signal to the multiplexer 63 and the multiplexer 63 outputs the direct voltage 3.3V. According to the above operation, the second control signal S2 can be easily implemented.

Figure 8:
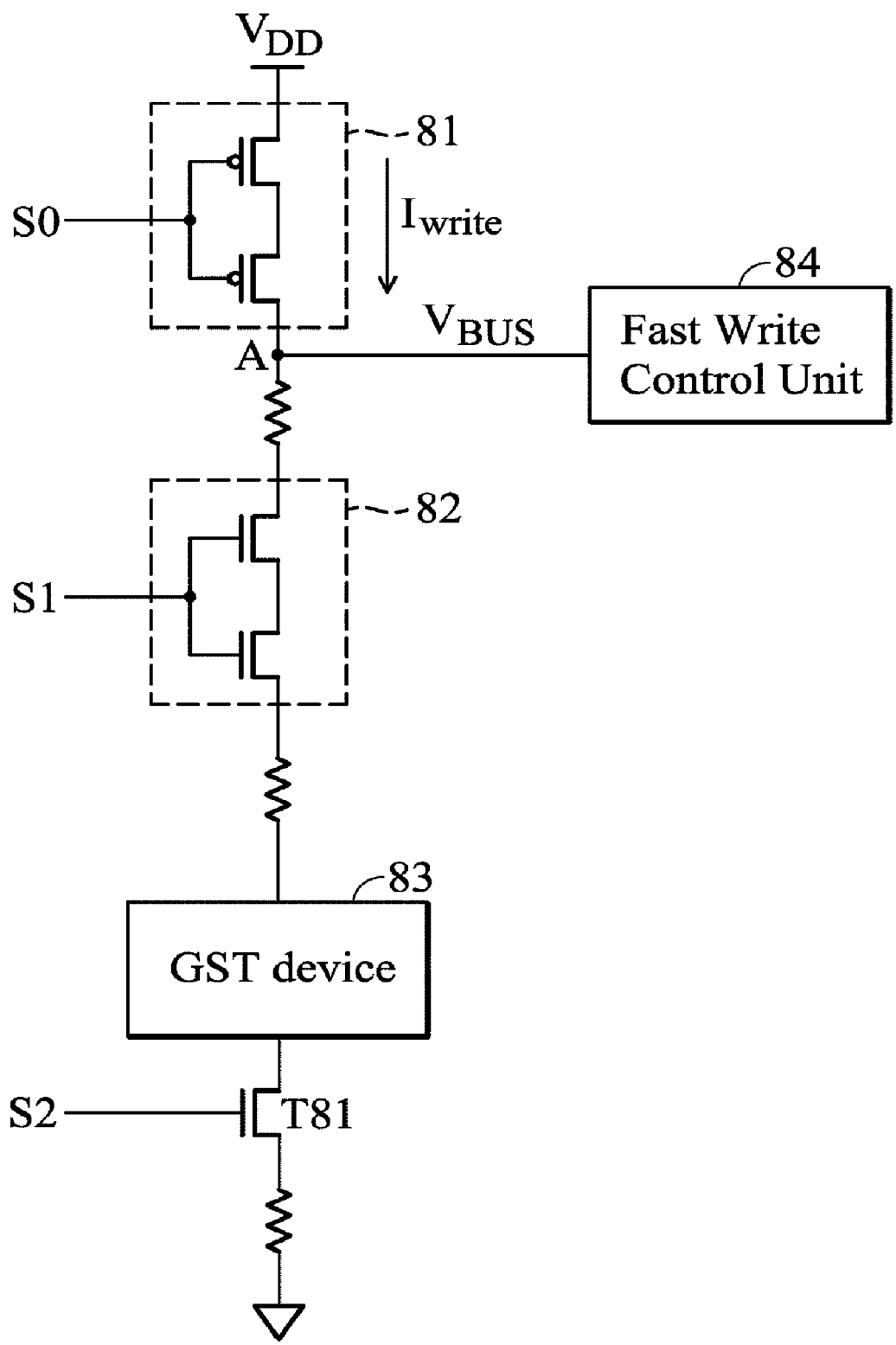
FIG. 8 is a schematic diagram of a writing path with a fast write control unit based on an embodiment of the invention.

FIG. 8 is a schematic diagram of a writing path with a fast write control unit based on an embodiment of the invention. In FIG. 8, the writing path comprises a current driving unit 81, a first switch device 82, a GST device 83, a transistor T81 and a fast write control unit 84, wherein the function of the transistor T81 is similar to the second switch device 44 in FIG. 4. In this embodiment, the writing path comprises only one phase change memory (PCM) cell, the GST device 83. In another embodiment, the writing path comprises a plurality of PCM cells and a phase change memory comprises a plurality of writing paths to form a phase change memory array arranged in a matrix form. The current driving unit 81 outputs the writing current Iwrite based on a control signal S0. In this embodiment, the current driving unit 81 comprises two PMOS transistors and when the PMOS transistors are turned on, the writing current Iwrite is generated due to the voltage $V_{DD}$. The first switch device 82 is controlled by a first control signal S1 and is turned on based on the first control signal S1. When the first switch device 82 is turned on, the writing current Iwrite is transmitted to the GST device 83. In this embodiment, the first switch device 82 comprises two NMOS transistors, and in another embodiment, the first switch device 82 may comprise one or a plurality of PMOS transistors, NMOS transistors, CMOS transistors, transmission gates or other similar elements.

The transistor T81 is coupled between the GST device 83 and a low voltage source, ground. The transistor T81 is controlled by a second control signal S2 and is turned on based on the second control signal S2. In this embodiment, only one NMOS transistor T81 is for example, however, in other embodiment, the transistor T81 can be replaced by one or a plurality of PMOS transistors, NMOS transistors, CMOS transistors, transmission gates or other similar elements. The fast write control unit 84 is coupled to the node A and provides a predetermined voltage to the node A. When the current driving unit 81 outputs the writing current Iwrite, the fast write control unit 84 stops providing the predetermined voltage to the writing path. When the current driving unit 81 does not output the writing current Iwrite, the fast write control unit 84 outputs the predetermined voltage to the writing path. In this embodiment, when the control signal S0 is at high voltage level, the fast write control unit 84 outputs the predetermined voltage to the writing path, and when the control signal S0 is at low voltage level, the fast write control unit 84 stops outputting the predetermined voltage to the writing path.

Figure 9:
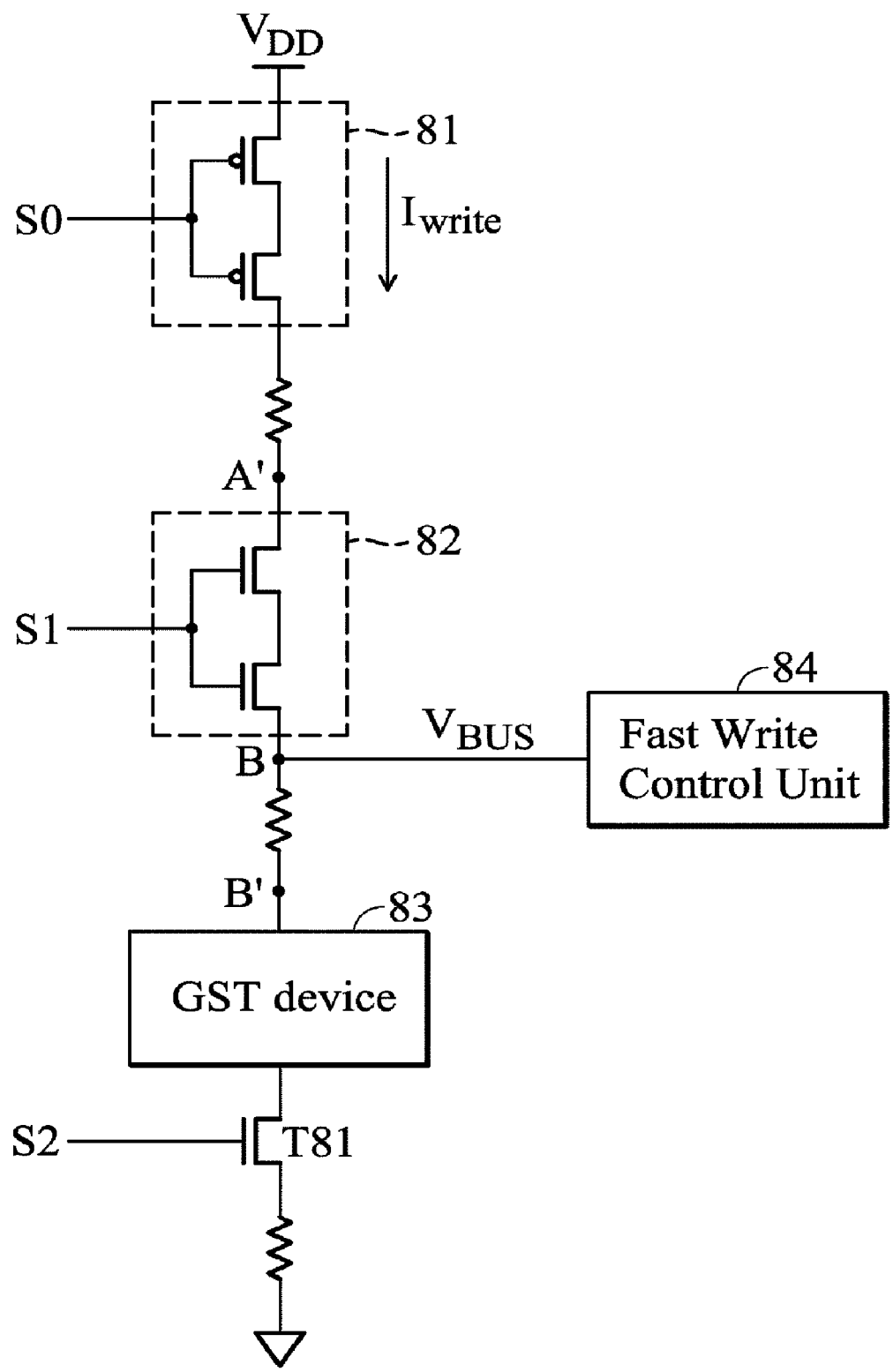
FIG. 9 is a schematic diagram of a writing path with a fast write control unit based on another embodiment of the invention.

FIG. 9 is a schematic diagram of a writing path with a fast write control unit based on another embodiment of the invention. Compared with the fast write control unit in FIG. 8, the only difference is that the fast write control unit 84 is coupled to the node B. When the first switch device 82 is turned on, the current driving unit 81 outputs the writing current Iwrite and the fast write control unit 84 stops outputting the predetermined voltage to the writing path. When the first switch device 82 is turned off, the current driving unit 81 does not output the writing current Iwrite and the fast write control unit 84 outputs the predetermined voltage to the writing path. In another embodiment, the fast write control unit 84 can be coupled to nodes A' or B'.

Figure 10:
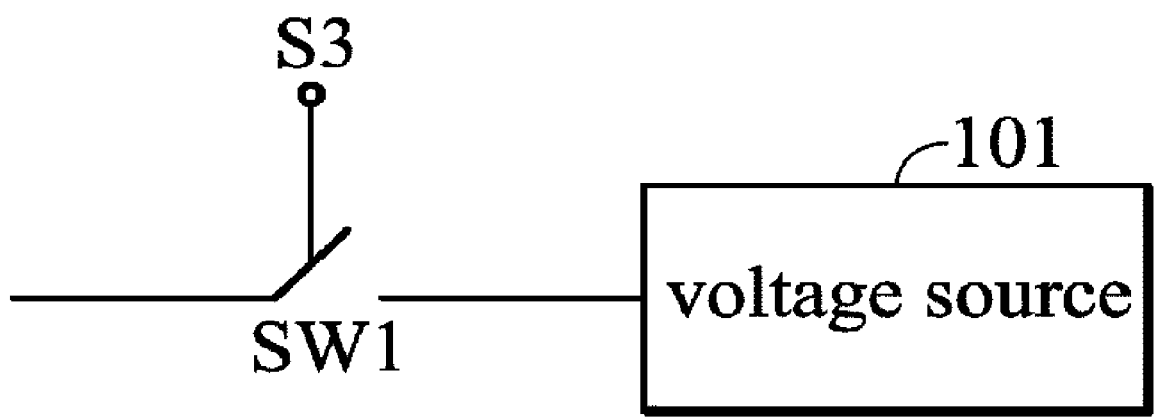
FIG. 10 is a schematic diagram of an embodiment of a fast write control unit of the invention.

FIG. 10 is a schematic diagram of an embodiment of a fast write control unit of the invention. The fast write control unit comprises a switch device SW1 and a voltage source 101. The switch device SW1 is controlled by a third control signal S3 and is turned on based on the third control signal S3. The voltage source 101 provides a predetermined voltage, wherein the predetermined voltage is a fixed DC voltage or an adjustable DC voltage. In this embodiment, the switch device SW1 is one or a plurality of PMOS transistors, NMOS transistors, CMOS transistors, transmission gates or other similar elements.

Figure 11:
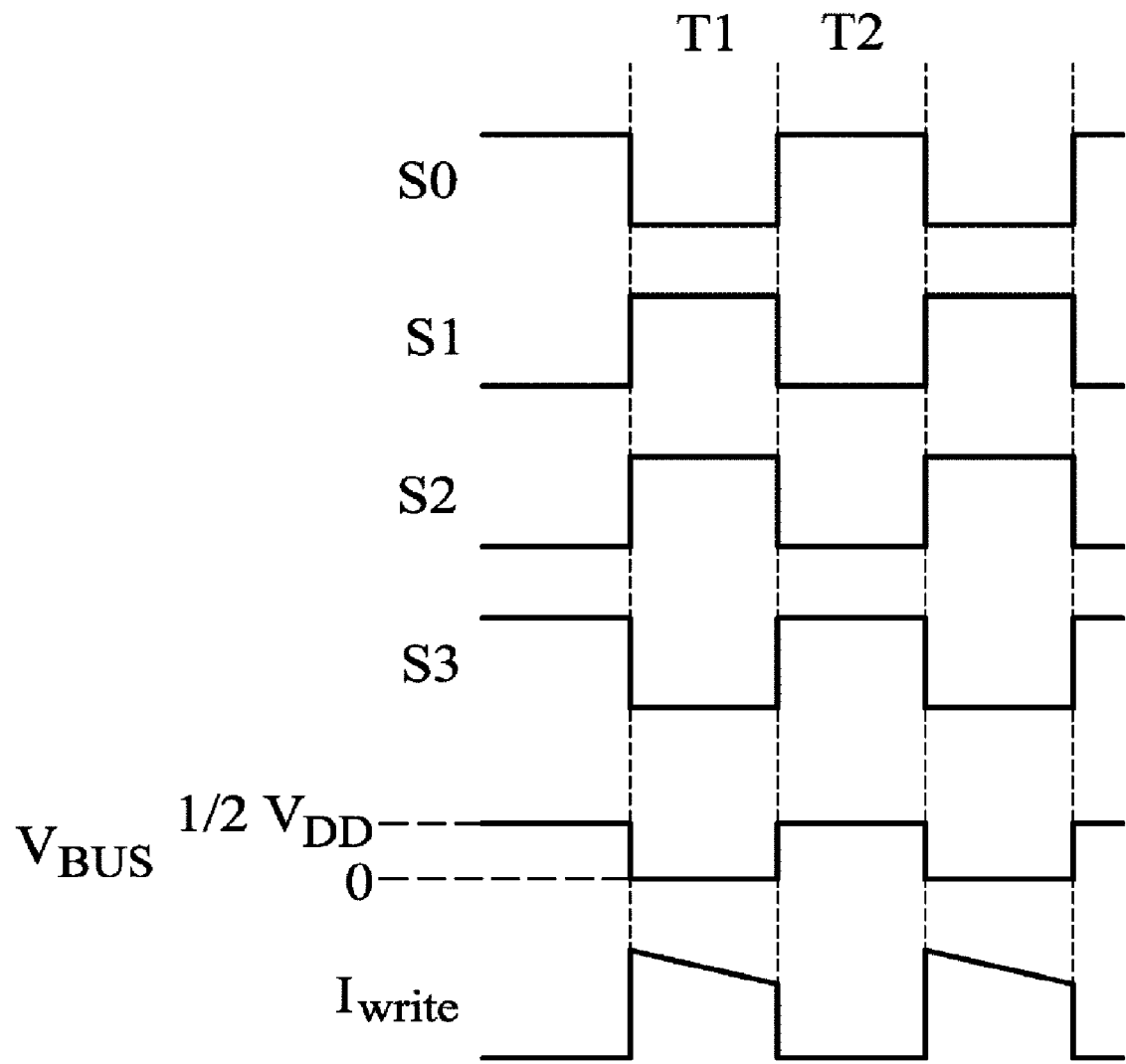
FIG. 11 is a timing diagram of the phase change memory writing circuit shown in FIG. 9 with the fast write control unit of FIG. 10.

FIG. 11 is a timing diagram of control signals in the phase change memory writing circuit shown in FIG. 9 with the fast write control unit of FIG. 10.

During the time period T2, the control signal S0 is at high voltage level, the first control signal S1 is at low voltage level, and the current driving unit 81 does not output the writing current Iwrite. Therefore, the fast write control unit 84 outputs the predetermined voltage, $V_{BUS}$, to the node B. In this embodiment, the switch device SW1 shown in FIG. 10 is a NMOS transistor, thus, the third control signal S3 is at high voltage level. Furthermore, the second control signal S2 is at low voltage level and the transistor T81 is turned off.

During the time period T1, the first control signal S0 is at low voltage level, the first control signal S1 is at high voltage level, the second control signal S2 is at high voltage level to turn on the transistor T81, and the current driving unit 81 outputs the writing current Iwrite. During the time period T1, the third control signal S3 is at low voltage level, thus, the fast write control unit 84 stops outputting the predetermined voltage $V_{BUS}$ to the node B. Although the fast write control unit 84 stops outputting the predetermined voltage $V_{BUS}$ to the node B, remaining voltage still exits at the node B, thus, avoiding the floating state in the node B when the writing current is input. During the time period T1, the writing current Iwrite is input to the GST device 83 and the writing current Iwrite is substantially maintained to the predetermined value till the current driving unit 81 stops outputting the writing current Iwrite.

In this embodiment, the voltage $V_{BUS}$ is ½ $V_{DD}$, but is not limited thereto. A person of ordinary skill in the art can adjust the magnitude of the voltage $V_{BUS}$ based on required circuit designs and specifications of the phase change memory. In a conventional writing path, the voltage level of the node B is pulled up from 0V to 3.3V when the conventional writing path receives the writing current. However, in our proposed writing path with fast write control unit, the voltage level of the node B is pulled up from 2V to 3.3V. Therefore, the write speed of the phase change memory is increased.

Figure 12:
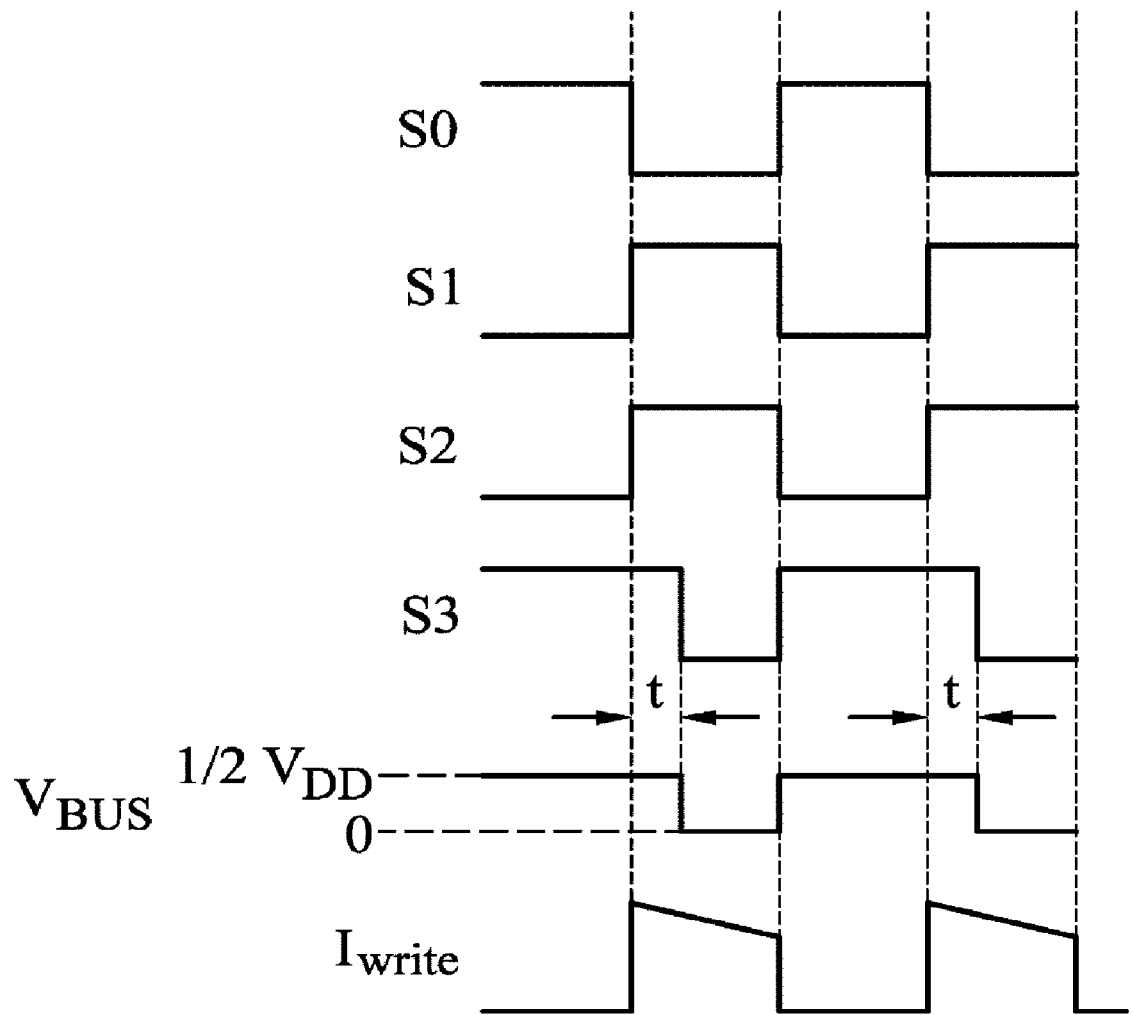
FIG. 12 is another timing diagram of control signals in the phase change memory writing circuit shown in FIG. 9 with the fast write control unit of FIG. 10.

FIG. 12 is another timing diagram of control signals in the phase change memory writing circuit shown in FIG. 9 with the fast write control unit of FIG. 10. Compared with the timing diagram in the FIG. 11, the difference is that the fast write control unit 84 does not stop outputting the predetermined voltage $V_{BUS}$ to the node B immediately when the current driving unit 81 outputs the writing current Iwrite. The fast write control unit 84 still outputs the predetermined voltage $V_{BUS}$ to the node B for a time duration t and after the time duration t, the fast write control unit 84 stops outputting the predetermined voltage $V_{BUS}$ to the node B. According to the operation, the write speed of the phase change memory can be increased and the writing current Iwrite received by the GST device 83 becomes more stable because the current curve of the writing current Iwrite in FIG. 12 is smoother than the current curve of the writing current Iwrite in FIG. 11.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory writing circuit, comprising:
   a writing path, comprising:
      a current driving unit coupled to a high voltage source to output a writing current;

a first switch device controlled by a first control signal; and a phase change memory cell, wherein the current driving unit, the first switch device and the phase change memory cell are coupled in series to allow the writing current to flow through the phase change memory cell when the first switch is turned on by the first control signal; and a fast write control unit coupled to the writing path to provide a predetermined voltage to the writing path at a node between the current driving unit and the phase change memory cell when the current driving unit does not output the writing current, wherein a magnitude of the predetermined voltage is half of a voltage provided by the high voltage source.

2. The circuit as claimed in claim 1, wherein the first switch device comprises a transistor.

3. The circuit as claimed in claim 1, wherein the writing path further comprises a second switch device controlled by a second control signal and the second switch device is coupled in series with the phase change memory cell and the first switch device between the current driving unit and a low voltage source.

4. The circuit as claimed in claim 3, wherein the second switch device comprises a transistor.

5. The circuit as claimed in claim 1, wherein when the current driving unit outputs the writing current, the fast write control unit stops outputting the predetermined voltage to the writing path.

6. The circuit as claimed in claim 1, wherein when the current driving unit does not output the writing current, the fast write control unit outputs the predetermined voltage to the writing path for a predetermined duration.

7. The circuit as claimed in claim 1, wherein the first switch device is coupled between the current driving unit and the phase change memory cell and said node is between the current driving unit and the first switch device or is between the first switch device and the phase change memory cell.

8. The circuit as claimed in claim 1, wherein the fast write control unit comprises:

a third switch device controlled by a third control signal; and a voltage source to provide the predetermined voltage to be output via the third switch.

9. The circuit as claimed in claim 8, wherein when the current driving unit does not output the writing current, the third switch device is turned on and the voltage generator provides the predetermined voltage to the writing path.

10. The circuit as claimed in claim 8, wherein the third switch device comprises a transistor.

11. The circuit as claimed in claim 8, wherein when the current driving unit outputs the writing current, the third switch device is turned off and the voltage generator stops outputting the predetermined voltage to the writing path.

12. The circuit as claimed in claim 8, wherein when the current driving unit outputs the writing current, the third switch device is turned on for a predetermined time and after the predetermined time, the third switch device is turned off and the voltage generator stops outputting the predetermined voltage to the writing path.

13. A phase change memory writing circuit, comprising:
a writing path, comprising:

a current driving unit coupled to a high voltage source to output a writing current;

a first switch device controlled by a first control signal and when the first control signal is at a first voltage level, the first switch device is turned on;

a phase change memory cell; and a second transistor controlled by a second control signal and coupled in series with the first switch device and the phase change memory between the current driving unit and a low voltage source, and when the second control signal is at a second voltage level, the second transistor is turned on; and a control signal generator to generate the second control signal, wherein the second control signal comprises a first pulse signal with a third voltage level and a second pulse signal with the second voltage level, and when a gate of the second transistor receives the first pulse signal with the third voltage level, the second transistor allows more current passing through the second transistor.

14. The circuit as claimed in claim 13, wherein the first switch device comprises a transistor.

15. The circuit as claimed in claim 13, wherein the second transistor is a NMOS transistor.

16. The circuit as claimed in claim 15, wherein the third voltage level is higher than the second voltage level.

17. The circuit as claimed in claim 13, wherein the second transistor is a PMOS transistor.

18. The circuit as claimed in claim 17, wherein the third voltage level is lower than the second voltage level.

19. The circuit as claimed in claim 13, wherein the control signal generator further comprises an address translate detector, and when the address translate detector detects a change of an address, the control signal generator outputs the first pulse signal.

* * * * *